US007564286B2

(12) United States Patent
Tamai et al.

(10) Patent No.: US 7,564,286 B2
(45) Date of Patent: Jul. 21, 2009

(54) CLOCK REGENERATION CIRCUIT

(75) Inventors: Hideaki Tamai, Tokyo (JP); Masayuki Kashima, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 12/073,330

(22) Filed: Mar. 4, 2008

(65) Prior Publication Data
US 2008/0258786 A1    Oct. 23, 2008

(30) Foreign Application Priority Data
Apr. 18, 2007    (JP)    ............... 2007-108839

(51) Int. Cl.
*H03K 3/00*    (2006.01)
(52) U.S. Cl. .................. 327/291; 327/299; 327/361
(58) Field of Classification Search .................. 327/165, 327/166, 355, 361, 291–294, 299
See application file for complete search history.

(56) References Cited
FOREIGN PATENT DOCUMENTS
JP    5-70044    9/1993

*Primary Examiner*—An T Luu
(74) *Attorney, Agent, or Firm*—Rabin & Berdo, P.C.

(57) ABSTRACT

A clock regeneration circuit includes a half-bit delay device that outputs a half-bit delayed signal B of a multi-level input signal A, a one-bit delay device that outputs a one-bit delayed signal C of the signal A, an adder, an attenuator that forms an threshold signal, an XOR circuit, and a BPF that outputs a clock signal with a frequency corresponding to a bit rate of the XOR signal. The XOR signal is calculated as an XOR of a two-level input signal F, which is a logical zero when a level of the signal A is no more than a level of the threshold signal and otherwise is a logical one, and a two-level input signal G, which is a logical zero when a level of the signal B is no more than the level of the threshold signal and otherwise is a logical one.

6 Claims, 4 Drawing Sheets

CLOCK REGENERATION CIRCUIT

CROSS-REFERENCE TO RELATED APPLICATION

This application claims priority under 35 USC 119 from Japanese Patent Application No. 2007-108839, the disclosure of which is incorporated by reference herein.

BACKGROUND OF THE INVENTION

1. Field of the Invention

The present invention relates to a clock regeneration circuit which inputs a multi-level input signal, with at least two signal levels, and outputs a clock signal synchronized with a period of the multi-level input signal.

2. Description of the Related Art

Heretofore, a clock regeneration circuit that inputs a two-level signal and outputs a clock signal synchronized with a period of the two-level signal has been proposed (see, for example, Japanese Utility Model Application Laid-Open (JP-U) No. 5-70044). FIG. 1 is a block diagram schematically showing structure of a conventional clock regeneration circuit. In the clock regeneration circuit shown in FIG. 1, a half-bit delay device 11 delays a two-level signal inputted at an input terminal by a duration corresponding to half of a one-bit length, and an exclusive-OR (XOR) circuit 12 calculates XOR values of the inputted two-level signal and a two-level signal that is outputted from the half-bit delay device 11. A band-pass filter (BPF) 13 extracts a bit rate base frequency component from output of the XOR circuit 12, and thus regenerates a clock signal which is synchronized with a period of the two-level input signal.

For the conventional clock regeneration circuit described above, the input signal is assumed to be a two-level NRZ signal. However, if a multi-level input signal with three or more signal levels were to be inputted to the above-described conventional clock regeneration circuit, the following problem would arise.

For an n-level signal taking n signal levels (n being an integer of at least 3), there are (n−1) ranges in which a threshold can be set—between 0 and 1, between 1 and 2, . . . , or between (n−1) and n. If a threshold value of the XOR circuit 12 is set to one of the above-mentioned (n−1) ranges, edges of the multi-level input signal that can be detected are limited to edges that cross the specified single threshold. Therefore, electrical power of the signal outputted from the XOR circuit 12 is greatly reduced, and consequently electrical power of the clock signal outputted from the BPF 13 is also smaller. Therefore, if a multi-level signal were to be inputted to the conventional clock regeneration circuit, the clock signal would be very susceptible to the effects of external noise, and quality of the clock signal would fall.

SUMMARY OF THE INVENTION

The present invention has been devised taking into consideration the above-described previous technology, and will provide a clock regeneration circuit capable of regenerating a high-quality clock signal from a multi-level input signal.

One aspect of the present invention is a clock regeneration circuit at which a multi-level input signal of a predetermined period, with at least two signal levels, is inputted and which outputs a clock signal synchronized with the predetermined period, the clock regeneration circuit including: a first delay device that delays the multi-level input signal by a duration shorter than a one-bit length of the multi-level input signal and outputs a first multi-level delayed signal; a second delay device that delays the multi-level input signal by a duration of the one-bit length of the multi-level input signal and outputs a second multi-level delayed signal; an adder that adds the second multi-level delayed signal with the multi-level input signal and outputs an added signal; an attenuator that attenuates the added signal and outputs a threshold signal; an exclusive or circuit, at which the multi-level input signal, the first multi-level delayed signal and the threshold signal are inputted, that calculates an exclusive or of (a) a two-level input signal which is at a logical zero when a level of the multi-level input signal is less than or equal to a level of the threshold signal and is at a logical one when the level of the multi-level input signal is higher than the level of the threshold signal and (b) a two-level delayed signal which is at a logical zero when a level of the first multi-level delayed signal is less than or equal to the level of the threshold signal and is at a logical one when the level of the first multi-level delayed signal is higher than the level of the threshold signal, and outputs a result of this calculation as an exclusive or signal; and a clock regeneration element that outputs the clock signal with a frequency corresponding to a bit rate of the exclusive or signal.

According to the clock regeneration circuit of the present invention, a threshold value of the XOR circuit is suitably altered in accordance with the multi-level input signal, and a proportion of edges of the multi-level input signal that cross the threshold is increased. Consequently, amplitude of the clock signal (electrical power) is larger, and a higher quality clock signal can be regenerated.

BRIEF DESCRIPTION OF THE DRAWINGS

An exemplary embodiment of the present invention will be described in detail based on the following figures, wherein.

DETAILED DESCRIPTION OF THE INVENTION

Figure 2:
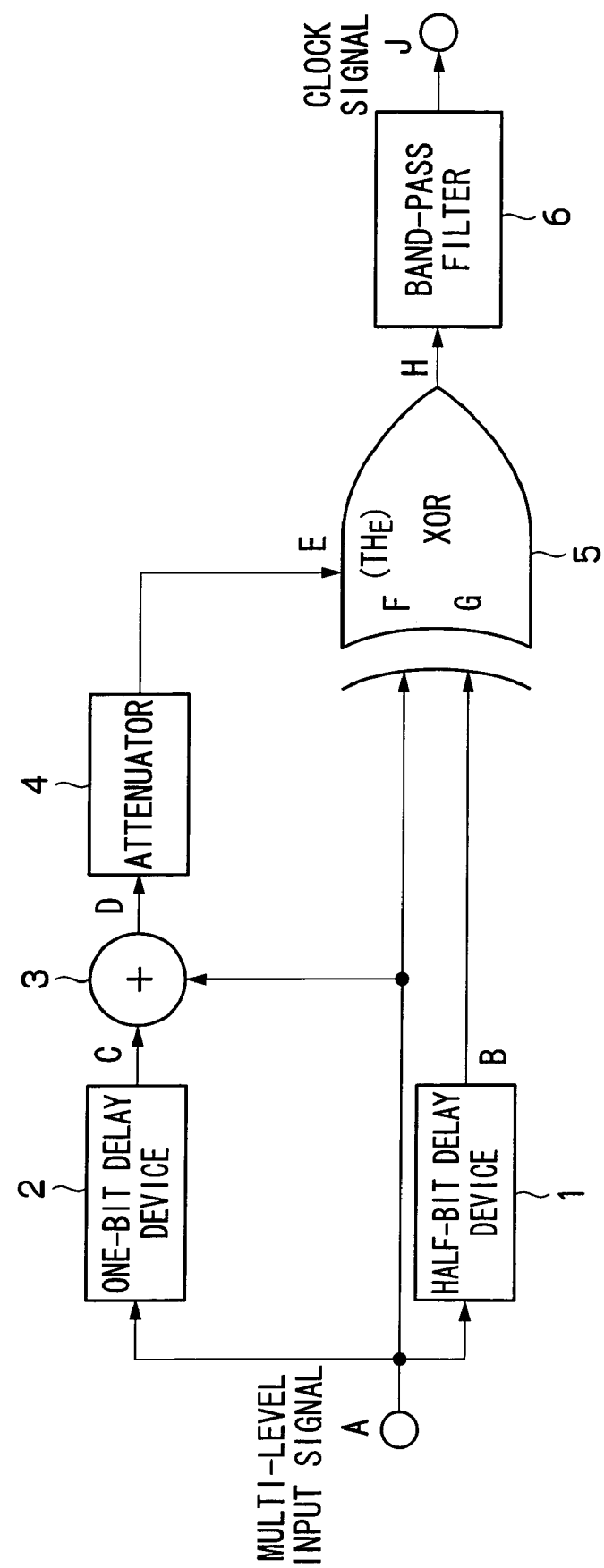
FIG. 2 is a block diagram schematically showing structure of a clock regeneration circuit of an exemplary embodiment of the present invention.

FIG. 2 is a block diagram schematically showing structure of a clock regeneration circuit of an exemplary embodiment of the present invention. As shown in FIG. 2, the clock regeneration circuit of the present embodiment is a circuit at which a multi-level input signal A with a predetermined period, with at least two signal levels, is inputted and which outputs a clock signal J, which is synchronized with the multi-level input signal A at the predetermined period. The clock regeneration circuit of the present embodiment includes a half-bit delay device 1, which serves as a first delay device, a one-bit delay device 2, which serves as a second delay device, an adder 3, an attenuator 4, an exclusive or (XOR) circuit 5 and a band-pass filter (BPF) 6. The clock regeneration circuit of the present embodiment can be used with a multi-level input signal A that has two or more signal levels, but particularly features functionality for high-quality clock regeneration with a multi-level input signal of three or more signal levels.

The half-bit delay device 1 inputs the multi-level input signal A with the predetermined period (herebelow, a four-level signal in FIG. 3), delays the multi-level input signal by a half-bit length, which is a duration shorter than a one-bit length of the multi-level input signal A (herebelow, time Tb shown in FIG. 3), and outputs a half-bit delayed signal (a first multi-level delayed signal) B. Here, a case is exemplified in which the delay duration is a duration corresponding to the half-bit length. However, the delay duration may be a different duration provided it is a duration shorter than the one-bit length.

The one-bit delay device 2 inputs the multi-level input signal A with the predetermined period, delays the multi-level input signal A by a duration corresponding to the one-bit length of the multi-level input signal A (herebelow, time Tb shown in FIG. 3), and outputs a one-bit delayed signal (a second multi-level delayed signal) C.

The adder 3 adds the one-bit delayed signal C with the multi-level input signal A and outputs an added signal D.

The attenuator 4 attenuates the added signal D, by multiplying the added signal D with an attenuation ratio, and outputs the added signal D that has been multiplied with the attenuation ratio to serve as a threshold signal E. The attenuation ratio of the attenuator 4 is a fixed attenuation ratio determined in advance, and is set in a range between 0 and 1. The attenuation ratio that is used may be, for example, 0.5.

The XOR circuit 5 inputs the multi-level input signal A, the half-bit delayed signal B and the threshold signal E, and outputs an XOR signal H. A two-level input signal F is at a logical zero when a voltage level of the multi-level input signal A is less than or equal to a voltage level of the threshold signal E (i.e., level $TH_E$ shown in FIG. 3, and is at a logical one when the voltage level of the multi-level input signal A is higher than the voltage level of the threshold signal E (i.e., level $TH_E$ shown in FIG. 3). A two-level input signal G is at a logical zero when a voltage level of the half-bit delayed signal B is less than or equal to the voltage level of the threshold signal E (i.e., level $TH_E$ shown in FIG. 3), and is at a logical one when the voltage level of the half-bit delayed signal B is higher than the voltage level of the threshold signal E (i.e., level $TH_E$ shown in FIG. 3). The XOR circuit 5 calculates an exclusive or between the two-level input signal F and the two-level input signal G, and outputs a result of this calculation to serve as the XOR signal H.

The BPF 6 is an element which outputs the clock signal J at a frequency corresponding to a bit rate of the XOR signal H.

Figure 3:
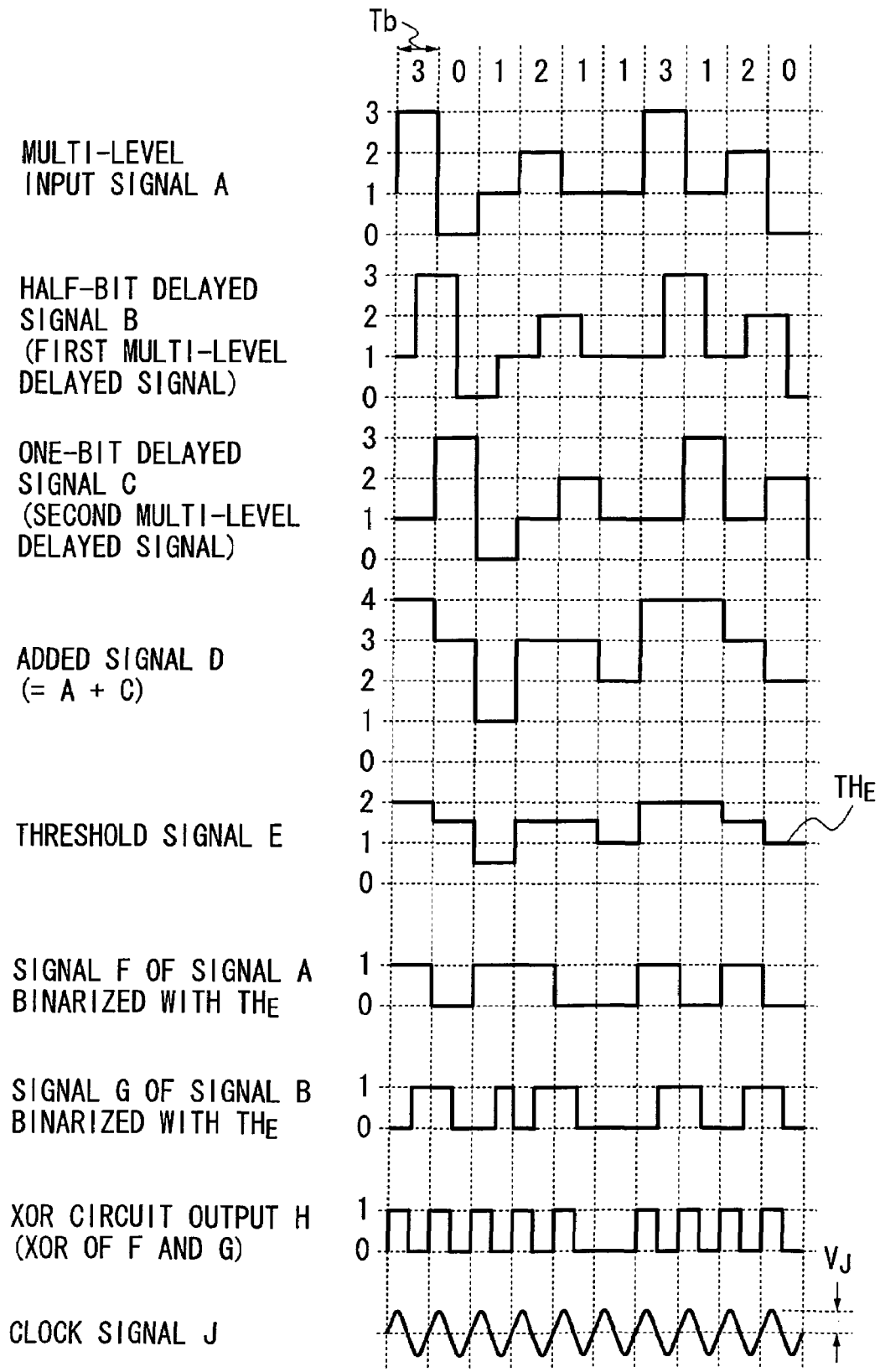
FIG. 3 is waveform charts showing operations of the clock regeneration circuit shown in FIG. 2.

FIG. 3 is waveform charts showing operations of the clock regeneration circuit illustrated in FIG. 2. The multi-level input signal A is a four-level signal of which signal levels are at four levels: 0, 1, 2 and 3. In FIG. 3, as an example, the multi-level input signal A is illustrated for a case in which the signal level changes in the sequence 3, 0, 1, 2, 1, 1, 3, 1, 2, 0, with a period corresponding to the duration of the one-bit length Tb. Signal levels in the present invention may be levels other than these four values, and signal levels in the present invention are not limited to the example shown in FIG. 3.

As shown in FIG. 2 and FIG. 3, the multi-level input signal A is split into four and inputted into the half-bit delay device 1, the one-bit delay device 2, the adder 3 and the XOR circuit 5. A delay with the duration corresponding to half of the bit period Tb (i.e., Tb/2) is applied to the multi-level input signal A inputted to the half-bit delay device 1, after which this is inputted to the XOR circuit 5 as the half-bit delayed signal B.

A delay with the duration corresponding to the one-bit period Tb is applied to the multi-level input signal A inputted to the one-bit delay device 2, after which this is inputted to the adder 3 as the one-bit delayed signal C. The adder 3 adds the multi-level input signal A and the one-bit delayed signal C, and outputs the added signal D. The attenuator 4 attenuates the signal level of the added signal D by half, thereby generating the threshold signal E, and inputs this to a threshold-setting terminal of the XOR circuit 5.

A circuit that is structured by the one-bit delay device 2, the adder 3 and the attenuator 4 realizes a function of outputting an arithmetic average of the signal level of a current bit of the multi-level input signal A and the signal level of a bit one bit before. This average serves as the threshold signal E, and is inputted to the threshold-setting terminal of the XOR circuit 5. Thus, as shown in FIG. 3, the threshold signal E at the XOR circuit 5 is adjusted for each bit.

In the XOR circuit 5, the multi-level input signal A is binarized by the threshold level $TH_E$ based on the threshold signal E to form the two-level input signal F, and the half-bit delayed signal B, which is the first multi-level delayed signal of the multi-level input signal A, is binarized by the threshold level $TH_E$ based on the threshold signal E to form the two-level input signal G. Then, the XOR circuit 5 calculates an XOR of the two two-level input signals F and G, and outputs the XOR signal H, which is a result of the calculation. Thereafter, a basic wave component of the bit rate of the XOR signal H is extracted, and the clock signal J is regenerated.

As shown in FIG. 3, in the present embodiment in which the threshold level $TH_E$ of the threshold signal E is adjusted bit-by-bit, as shown by the XOR signal H in FIG. 3, the XOR signal H which is outputted from the XOR circuit 5 is generated in the form of numerous bit pulses (nine bit pulses in FIG. 3). Therefore, electrical power of the XOR signal H that is outputted from the XOR circuit 5 is greatly increased, and amplitude (electrical power) of the clock signal J that is outputted from the BPF 6 is also greatly increased. Thus, according to the clock regeneration circuit of the present embodiment, when the clock signal J is being generated from the multi-level input signal A, there is little susceptibility to the effects of external noise, and the clock signal J can be formed with high quality.

Figure 1:
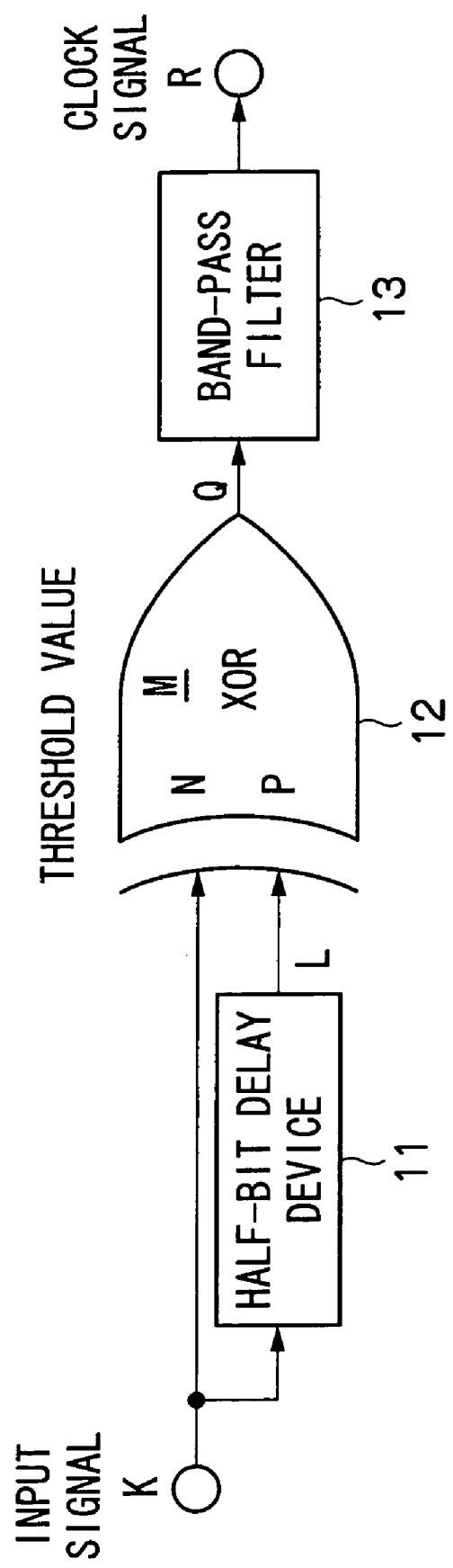
FIG. 1 is a block diagram schematically showing structure of a conventional clock regeneration circuit.
Figure 4:
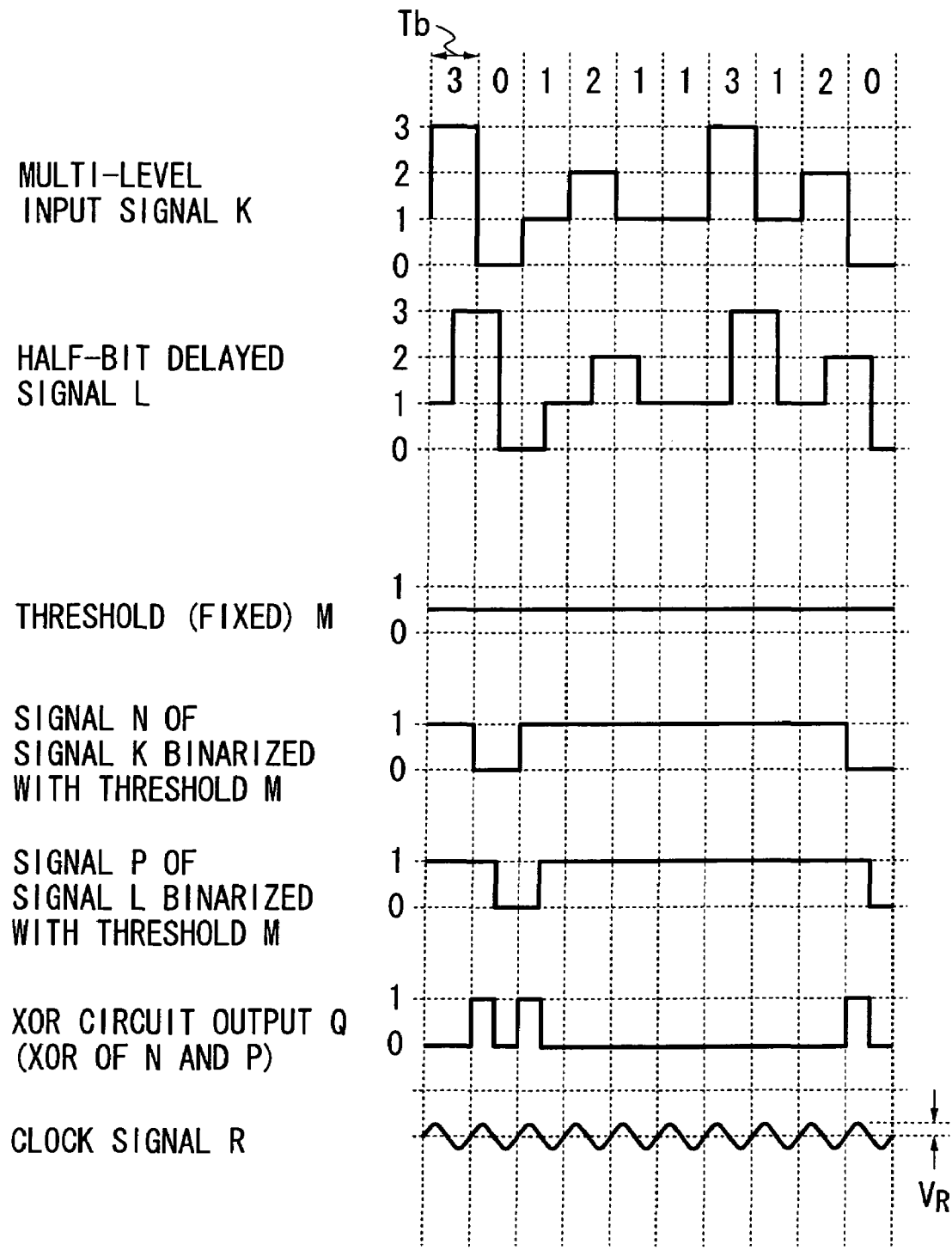
FIG. 4 is waveform charts showing operations of a comparative example in which a four-level signal is inputted to the clock regeneration circuit shown in FIG. 1.

FIG. 4 is waveform charts showing operations of a comparative example in which a four-level signal is inputted to the clock regeneration circuit of FIG. 1 (a conventional example). In the comparative example shown in FIG. 4, a multi-level input signal K is the same as the signal A shown in FIG. 3, being a four-level signal of which signal levels are at four levels: 0, 1, 2 and 3. In FIG. 4, the multi-level input signal K changes in the sequence 3, 0, 1, 2, 1, 1, 3, 1, 2, 0, with a period corresponding to the duration of the one-bit length Tb.

In the comparative example shown in FIG. 1 and FIG. 4, the multi-level input signal K is split in two and inputted into the half-bit delay device 11 and the XOR circuit 12. A delay with the duration (Tb/2) corresponding to half of the bit rate Tb is applied to the multi-level input signal K inputted to the half-bit delay device 11, after which this is inputted to the BPF 13 as a half-bit delayed signal L. In the XOR circuit 12, the multi-level input signal K and the half-bit delayed signal L are binarized by a threshold M, to form a two-level input signal N and a two-level input signal P, respectively. An XOR of the two-level input signal N and the two-level input signal P is calculated, and an XOR signal Q which is a result of this calculation is outputted. Thereafter, the XOR signal Q passes through the BPF 13, a basic wave component of the bit rate of the XOR signal Q is extracted, and a clock signal R is generated.

Since the threshold M is fixed in the comparative example shown in FIG. 4, as shown by the signal Q in FIG. 4, the output signal Q of the XOR circuit is generated as only a small number of bit pulses (three bit pulses). Therefore, electrical power of the signal outputted from the XOR circuit 12 is greatly reduced, and amplitude (electrical power) of the clock signal outputted from the BPF 13 is also greatly reduced.

Thus, in the comparative example shown in FIG. 4, the clock signal R is more susceptible to the effects of external noise, and quality of the clock signal R falls.

As is seen by comparison of the XOR signal H of FIG. 2 illustrating the present embodiment with the XOR signal Q of FIG. 4 illustrating the comparative example, in the present embodiment, the threshold level $TH_E$ is suitably controlled. As a result, more numerous bit signals are outputted as the output of the XOR signal H, and electrical power of the XOR signal H that is outputted from the XOR circuit 5 is greatly increased. Therefore, as is seen by comparison of an amplitude $V_J$ of the BPF output signal J in FIG. 3 illustrating the present embodiment with an amplitude $V_R$ of the BPF output signal R in FIG. 4 illustrating the comparative example, in the case of the present embodiment, attenuation of the XOR signal H outputted from the XOR circuit 5 is smaller.

As has been described above, according to the clock regeneration circuit of the present embodiment, the threshold level $TH_E$ of the XOR circuit 5 is suitably altered in accordance with the multi-level input signal A, and a proportion of edges of the multi-level input signal A that cross over the threshold level $TH_E$ is increased. Consequently, power of the XOR signal H is greatly increased, and a high-quality clock signal J can be regenerated.

In addition, in accordance with requirements, a PLL (phase-locked loop) circuit (not shown) may be provided subsequent to the BPF 6. When the PLL is provided, jitter of the clock signal J can be reduced.

What is claimed is:

1. A clock regeneration circuit at which a multi-level input signal of a predetermined period, with at least two signal levels, is inputted and which outputs a clock signal synchronized with the predetermined period, the clock regeneration circuit comprising:

a first delay device that delays the multi-level input signal by a duration shorter than a one-bit length of the multi-level input signal and outputs a first multi-level delayed signal;

a second delay device that delays the multi-level input signal by a duration of the one-bit length of the multi-level input signal and outputs a second multi-level delayed signal;

an adder that adds the second multi-level delayed signal with the multi-level input signal and outputs an added signal;

an attenuator that attenuates the added signal and outputs a threshold signal;

an exclusive or circuit, at which the multi-level input signal, the first multi-level delayed signal and the threshold signal are inputted, that calculates an exclusive or of (a) a two-level input signal which is at a logical zero when a level of the multi-level input signal is less than or equal to a level of the threshold signal and is at a logical one when the level of the multi-level input signal is higher than the level of the threshold signal and (b) a two-level delayed signal which is at a logical zero when a level of the first multi-level delayed signal is less than or equal to the level of the threshold signal and is at a logical one when the level of the first multi-level delayed signal is higher than the level of the threshold signal, and outputs a result of this calculation as an exclusive or signal; and a clock regeneration element that outputs the clock signal with a frequency corresponding to a bit rate of the exclusive or signal.

2. The clock regeneration circuit of claim 1, wherein the first delay device delays the multi-level input signal by a duration of half of the one-bit length of the multi-level input signal.

3. The clock regeneration circuit of claim 1, wherein the attenuator attenuates the added signal which is the output of the adder with a constant attenuation ratio.

4. The clock regeneration circuit of claim 3, wherein the constant attenuation ratio is 0.5.

5. The clock regeneration circuit of claim 1, wherein the clock regeneration element comprises a band-pass filter.

6. The clock regeneration circuit of claim 1, wherein the multi-level input signal is a signal of at least three levels.

* * * * *